US006412096B1

(12) United States Patent
Ventrone

(10) Patent No.: US 6,412,096 B1
(45) Date of Patent: Jun. 25, 2002

(54) METHOD AND APPARATUS FOR A HEDGE ANALYSIS TECHNIQUE FOR PERFORMANCE IMPROVEMENTS OF LARGE SCALE INTEGRATED CIRCUIT LOGIC DESIGN

(75) Inventor: Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,154

(22) Filed: Apr. 30, 1999

(51) Int. Cl.$^7$ ............................................... G06F 17/50
(52) U.S. Cl. ...................................................... 716/2
(58) Field of Search ............................... 716/2, 17, 18; 364/489; 395/500

(56) References Cited

U.S. PATENT DOCUMENTS

| | | | |
|---|---|---|---|
| 5,003,487 A | | 3/1991 | Drumm et al. |
| 5,159,682 A | * | 10/1992 | Toyonaga et al. ............ 395/500 |
| 5,396,435 A | * | 3/1995 | Ginetti ........................ 364/489 |
| 5,397,749 A | | 3/1995 | Igarashi |
| 5,426,591 A | | 6/1995 | Ginetti et al. |
| 5,461,574 A | * | 10/1995 | Matsunaga et al. ......... 364/489 |
| 5,544,071 A | | 8/1996 | Keren et al. |
| 5,550,748 A | | 8/1996 | Xiong |
| 5,638,290 A | | 6/1997 | Ginetti et al. |
| 5,654,898 A | | 8/1997 | Roetcisoender et al. |
| 5,666,290 A | | 9/1997 | Li et al. |

OTHER PUBLICATIONS

IBM Technical Disclosure Bulletin, Timing–Influenced Layout Design vol. 28, No. 11, Apr. 1986.
IBM Technical Disclosure Bulletin, Time–Driven CMOS Gate Placement, vol. 33, No. 1A, Jun. 1990.
IBM Technical Disclosure Bulletin, Floorplanning By Constraint Reduction, vol. 33, No. 5, Oct. 1990.
IBM Technical Disclosure Bulletin, Data Flow Design, vol. 35, No. 4A, Sep. 1992.
IBM Technical Disclosure Bulletin, Algorithm for Incremental Timing Analysis, vol. 38, No. 01, Jan. 1995.

* cited by examiner

Primary Examiner—David Nelms
Assistant Examiner—Thong Le
(74) Attorney, Agent, or Firm—DeLio & Peterson, LLC; Robert Curcio; Mark F. Chadurjian

(57) ABSTRACT

An apparatus and method for performing a Hedge Technique Analysis are used to enhance the performance of the functional logic design of a large scale integrated circuit while simplifying the underlying logic. The methodology first runs performance tests on the logic circuitry to assess the timing and characterize the logic paths; next, functional paths are identified and listed; common logic path leaves, twigs, and branches are then identified and ranked by the number of critical paths associated with each; all high ranking common logic path leaves, twigs, and branches are then collapsed; and, timing paths are re-run to characterize the final performance rating of the functional design.

9 Claims, 10 Drawing Sheets

METHOD AND APPARATUS FOR A HEDGE ANALYSIS TECHNIQUE FOR PERFORMANCE IMPROVEMENTS OF LARGE SCALE INTEGRATED CIRCUIT LOGIC DESIGN

BACKGROUND OF THE INVENTION

1. Field of the Invention

This invention relates to a method and apparatus for optimizing an organization of many discrete elements. Specifically, a method and apparatus for optimizing the logic design of an integrated circuit to achieve a more simplified, less redundant, functional design capable of faster timing.

2. Description of Related Art

Computers are being employed more often to improve and enhance the organization of large scale integrated circuits. Such an organization is necessary for the resolution of a cell assignment problem of a logical functional element mask in a circuit mask layout. The cell element assignment determines a plurality of objectives, such as chip size and minimization, utilization of redundant functional elements, minimization of wire length, and enhanced circuit timing.

Logic designs follow typical design cycles. Usually, a first functional cycle is investigated. Next, a second cycle requires performance tuning and the elimination of logic defects or "bugs". As a product is performance tuned, a larger number of logic paths begin converging to a timing limit, necessitating operational frequencies in the hundreds of mega Hertz for proper operation. Typically, designers spend a substantial amount of time at this stage of the design employing static analysis tools in order to acquire a map of the logic paths over a selected clock cycle. The standard approach is to find the worse offenders contributing to timing constraints within the circuit, improve on these paths, and then sequentially move on to the next set of timing offenders. The prior art approaches this by moving the signal under inspection ahead in its timing path, and replacing the underlying cone of logic or redesigning the function associated with the path to make the circuit faster. However, as the timing paths or waves are completed, the number of associated paths that need to be improved begin increasing non-linearly, analogous to the number of leaves stemming from the twigs of the branches of a tree. Eventually, the number of logic paths that need timing improvement is so large that the designers declare a "performance wall" has been reached. In the current state of the art, all circuits reach their performance limit in the frequency range of a few hundred mega Hertz. If design requirements necessitate performance faster than this, other methodologies need to be employed. At this stage, the designers usually begin investigating different solutions for performance enhancements, such as technology migration. Unfortunately, the next available technology may be outside the market window for the integrated circuit (IC) under design. Another approach is do to a full-scale custom build of the IC. However, the cost of a custom build remains prohibitive, and the time to market for this type of build is further extended.

In U.S. Pat. No. 5,638,290 issued to Ginetti, et al., on Jun. 10, 1997, entitled, "METHOD FOR ELIMINATING A FALSE CRITICAL PATH IN A LOGIC CIRCUIT," a method is taught for removing the critical false paths taken place during logic optimization. This method automatically finds when a path node does not affect the behavior of the path output and so determines a false critical path. By finding a false critical path, this methodology effectively eliminates a function from the logic design. However, it fails to optimize the critical paths for timing.

In U.S. Pat. No. 5,654,898 issued to Roetcisoender, et al., on Aug. 5, 1997, entitled, "TIMING-DRIVEN INTEGRATED CIRCUIT LAYOUT THROUGH DEVICE SIZING," a method for determining the layout of an IC is taught, in accordance with timing constraints, by means of sizing the buffers in the layout. Based on delay data developed from the routing of parasitics, this invention calls on module generators to build cells with the output drive strength required to meet predetermined performance goals, which frequently requires modifying the buffer sizes. The buffers are resized so that the time delays in the time-critical paths are either brought within the predetermined timing criteria, or no further improvement in any time-critical path is possible. Thus, under this method, approaching the performance wall requires the resizing of buffers until a physical limit is reached where no further improvement is possible.

Bearing in mind the problems and deficiencies of the prior art, it is therefore an object of the present invention to provide a method and apparatus to analyze and enhance the total performance of the logic design of a large scale integrated circuit.

It is another object of the present invention to provide and method and apparatus to optimize the timing of an integrated circuit design.

A further object of the invention is to provide a method and apparatus overcome the shortcomings of prior art methods of minimizing circuit timing in large scale integrated circuits.

It is yet another object of the present invention to provide a computer aided design system and method for enhancing large scale integrated circuit timing, and optimizing the circuit paths in the logic design.

Another object of the present invention is to provide a computer aided design system and method to identify precise places in a large scale integrated circuit logic design to optimize performance and timing, and to maximize the circuit performance gain.

Still other advantages of the invention will in part be obvious and will in part be apparent from the specification.

SUMMARY OF THE INVENTION

The above and other advantages, which will be apparent to one of skill in the art, are achieved in the present invention which is directed to, in a first aspect, a method of designing a logic circuit comprising the steps of: identifying functional paths in the logic circuit that include multiple elements in common with other functional paths; grouping the identified functional paths into groups having functional paths with the same elements in common; ranking the groups according to a number of elements that the functional paths in each group have in common; and, optimizing a performance of a first group of functional paths into a second group of functional paths wherein a number of common elements in the functional paths of the second group is less than a number of common elements in the functional paths of the first group.

The present invention is directed to, in a second aspect, a method of designing a logic circuit having a plurality of logic functions, and logic paths having logic path elements, comprising the steps of: running performance tests on the logic circuit; listing all of the logic paths in the logic circuit; finding the logic path elements of the logic paths that are common to one another; ranking the common logic path elements by the number of critical paths associated with each, assigning a higher ranking value to the common logic path elements with the greater number of the critical paths;

collapsing the higher ranking common logic path elements to minimize propagation times of the logic circuit and eliminate redundancy in the logic functions; and, re-running the performance tests on the logic circuit.

In a third aspect, the present invention is directed to a method of designing a logic circuit having a plurality of logic functions, and logic paths having leaves, twigs, and branches as logic path elements, comprising the steps of: providing a computer processing system; generating a data structure to identify each of the logic path leaves in the logic circuit; running a performance test using the computer processing system on the logic circuit to characterize critical paths of the logic paths; cross-referencing the logic path leaves to the number of the critical paths associated with each of the logic path leaves; sorting and grouping the logic path leaves according to the number of the critical paths associated with each of the logic path leaves; and, performing a first level performance screen on the sorted and grouped logic path leaves.

Additionally, this third aspect may further comprise the steps of: cross-referencing the logic path twigs to the number of the critical paths associated with each of the logic path twigs; sorting and grouping the logic path twigs according to the number of the critical paths associated with each of the logic path twigs; customizing and optimizing common logic path twig groups to minimize propagation times of the logic circuit and eliminate redundancy in the logic functions; and, converting one or more of the common logic path twig groups into logic path leaves.

Further, this aspect may include the steps of: cross-referencing the logic path branches to the number of the critical paths associated with each of the logic path branches; sorting and grouping the logic path branches according to the number of the critical paths associated with each of the logic path branches; customizing and optimizing common logic path branch groups to minimize propagation times of the logic circuit and eliminate redundancy in the logic functions; and, converting one or more of the common logic path branch groups into logic path twigs.

The present invention is also directed to, in a fourth aspect, a program storage device readable by a machine, tangibly embodying a program of instructions executable by the machine to perform the method steps for designing a logic circuit having a plurality of logic functions, and logic paths having leaves, twigs, and branches as logic path elements, the method steps comprising; running performance tests on the logic circuit; listing all logic paths; finding the logic path leaves, twigs, and branches of the logic paths that are common to one another; ranking the common leaves, twigs, and branches of the logic paths by the number of critical paths associated with each, assigning a higher ranking value to the common logic path leaves, twigs, and branches with the greater number of the critical paths; collapsing the higher ranking common logic path leaves, twigs, and branches, to minimize propagation times of the logic circuit and eliminate redundancy in the logic functions; and, re-running the performance tests on the logic circuit.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
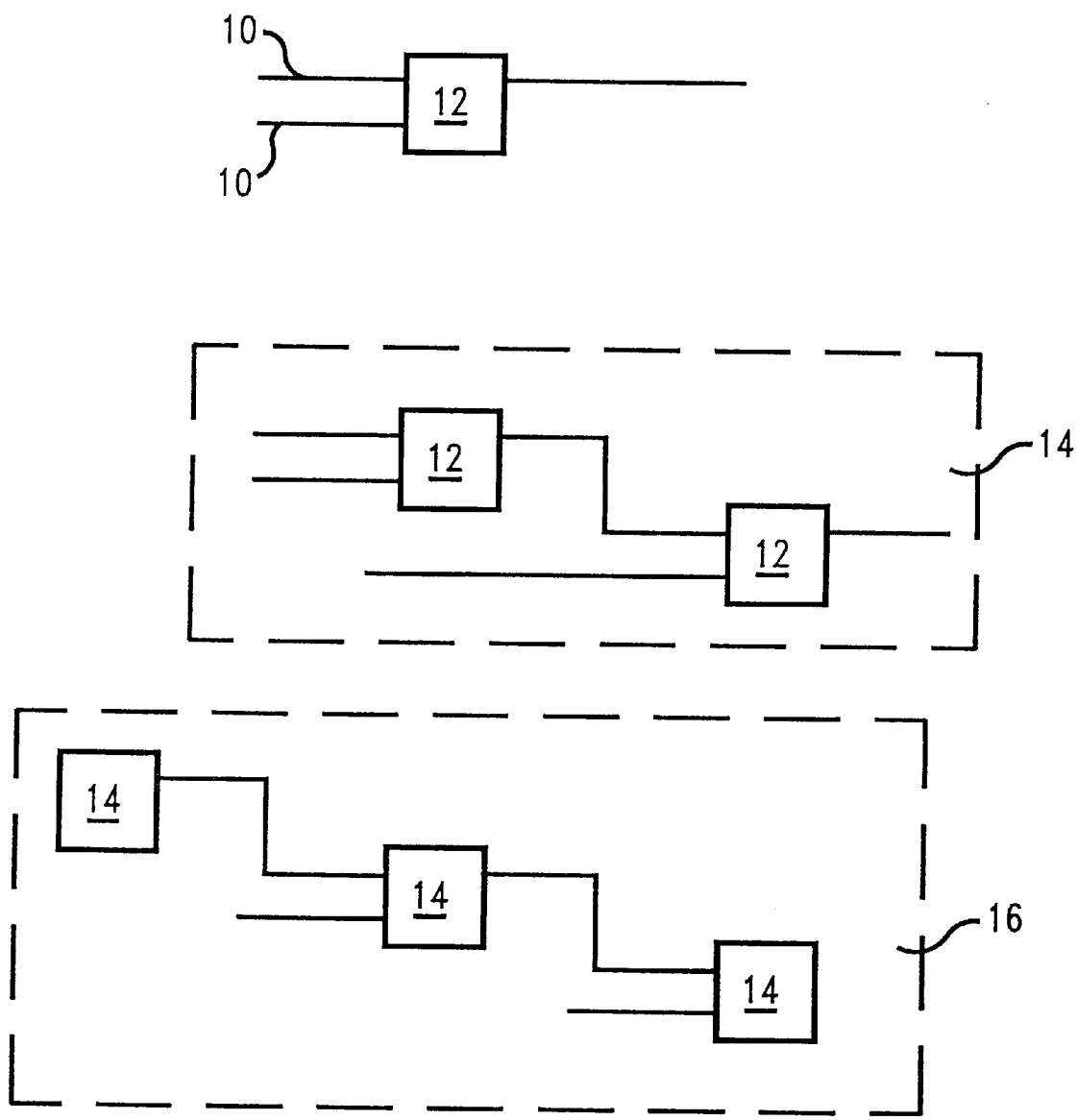
FIG. 1A is a block diagram of the logic elements depicting a leaf, twig, and branch.

In describing the preferred embodiment of the present invention, reference will be made herein to FIGS. 1–5 of the drawings in which like numerals refer to like features of the invention. Features of the invention are not necessarily shown to scale in the drawings.

As the design of a large scale integrated circuit becomes well tuned in terms of logic, timing, and function, it approaches a performance wall, beyond which inefficiencies in circuit timing, performance, and layout dominate. The circuit complexities increase non-linearly, thus rapidly diminishing the return on further design enhancements as the performance wall is approached. This performance wall can be described as the top of a "hedge" tree, where the logic paths are represented by the leaves, twigs, and branches of the hedge tree. The Hedge Analysis Technique represents a methodology to simplify the many logic paths present in a circuit layout, increase the timing of the circuitry, and reduce the redundancy inherent in these circuit designs. Referring to FIG. 1A, for the purposes of this invention, each instance of a circuit or book of logic 10 is called a leaf 12, such as an "AND" gate in the functional path; each unique combination of leaves (two books interconnected) is called a twig 14; and, an instance of two or more twigs is called a branch 16. To the designer, the number of leaves that exist within the design can be in the hundred of thousands, and in current/future designs the state of the art is approaching millions of leaves in a complex logic design. Manual analysis of the leaves is fast becoming an impractical task. In addition, since most designs are synthesized, most designers are less interested in the lower level versions of the leaf.

Figure 1B:
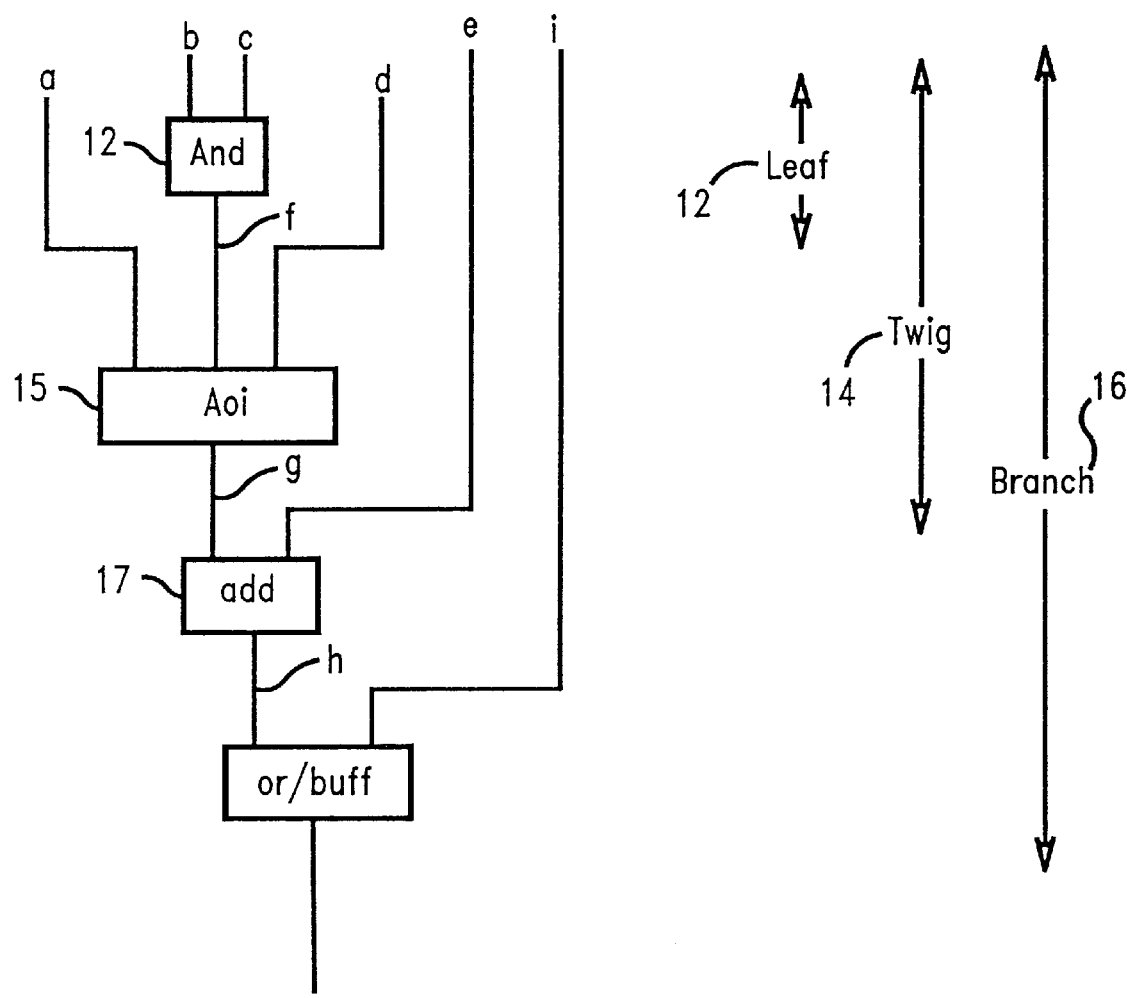
FIG. 1B is a block diagram of specific logic elements forming a leaf, twig, branch combination for an AND, AOI, ADD, and OR/BUFF network.

An example of the combination and merging of leaves into twigs, and twigs into branches, is depicted in FIG. 1B. Here, a leaf 12 is denoted by an AND gate. The leaf has inputs b, c and output f. The leaf output f feeds into an AOI (AND or INVERT) gate 15. Similarly, other leaf outputs a, d also feed gate 15. The AOI gate output g is an input to an ADD gate 17, which combines other inputs as well, represented by circuit line e. Together, the AND, AOI, and ADD gates may be combined to form twig 14. Output h from twig 14, along with outputs from other twigs, as represented by circuit line i, are then combined to form branch 16.

Figure 1C:
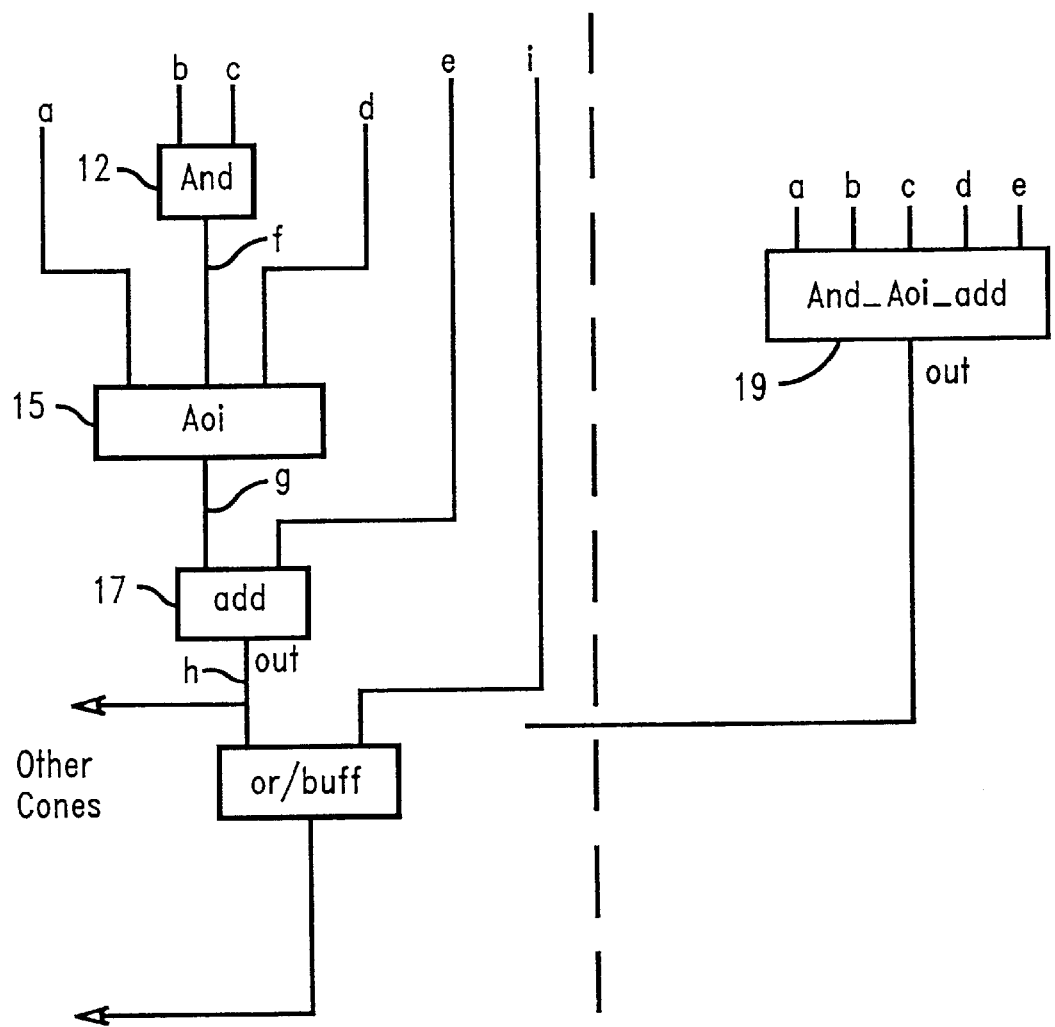
FIG. 1C depicts the combination of FIG. 1B being represented by combining the leaves and twigs.

FIG. 1C depicts the logical sequence of combining various leaves and twigs of FIG. 1B, using the Hedge Technique Analysis. Inputs a–e are logically combined into one logic element block or book 19. By performing this analysis, the most critical twigs on a branch can be identified, and a custom book (logic element block 19) having five inputs can functionally replace the complexity of the individual leaves and twigs for further analyses. By replacing numerous leaves and twigs in the critical path with one logic element block, simplicity in calculation, and reduction of redundant logic can be realized. Through this approach the operational "hedge" may be lowered, as the complex circuit logic paths become streamlined.

Figure 2A:
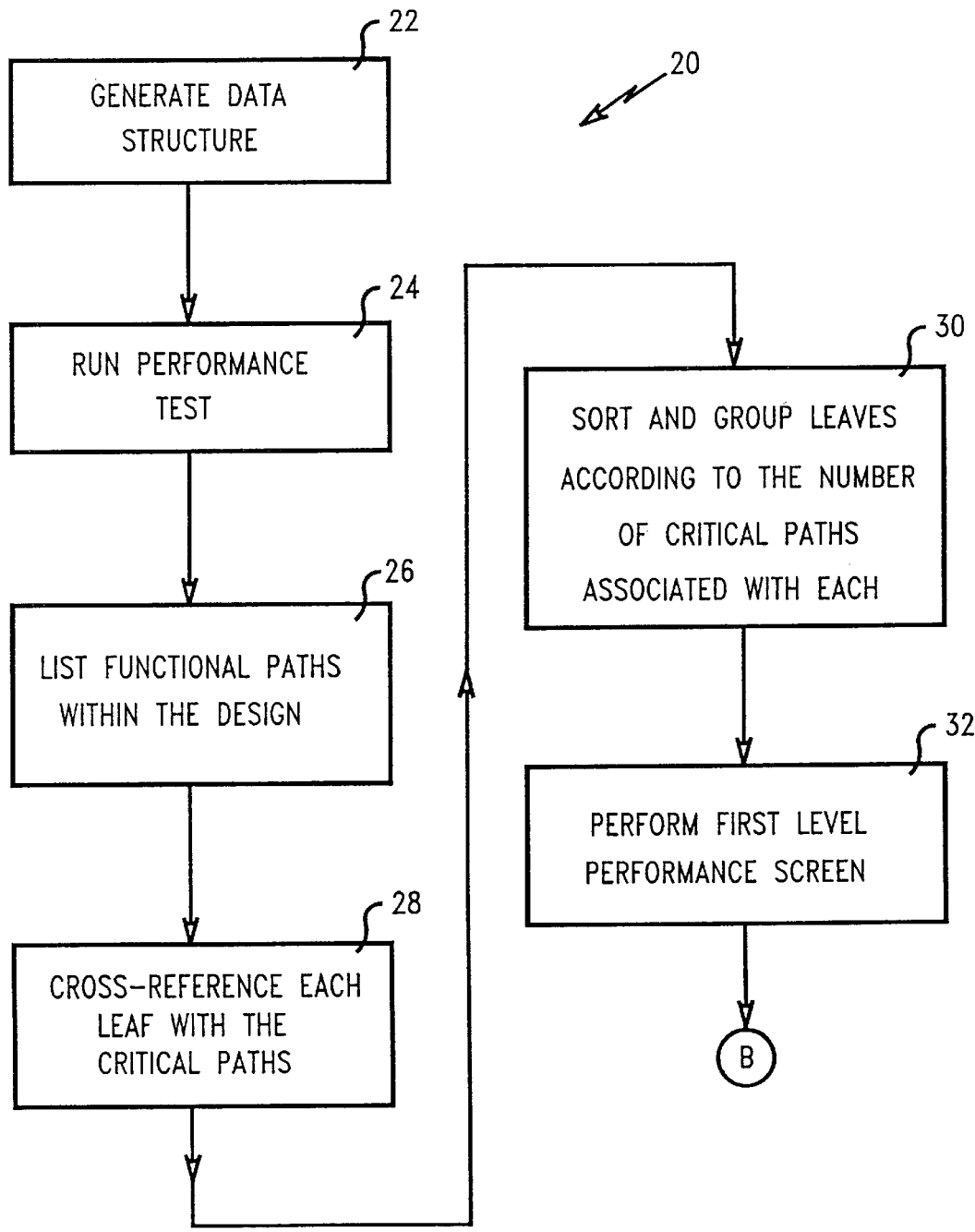
FIG. 2A is a flow chart of the Hedge Analysis Technique for optimizing leaves.
Figure 2B:
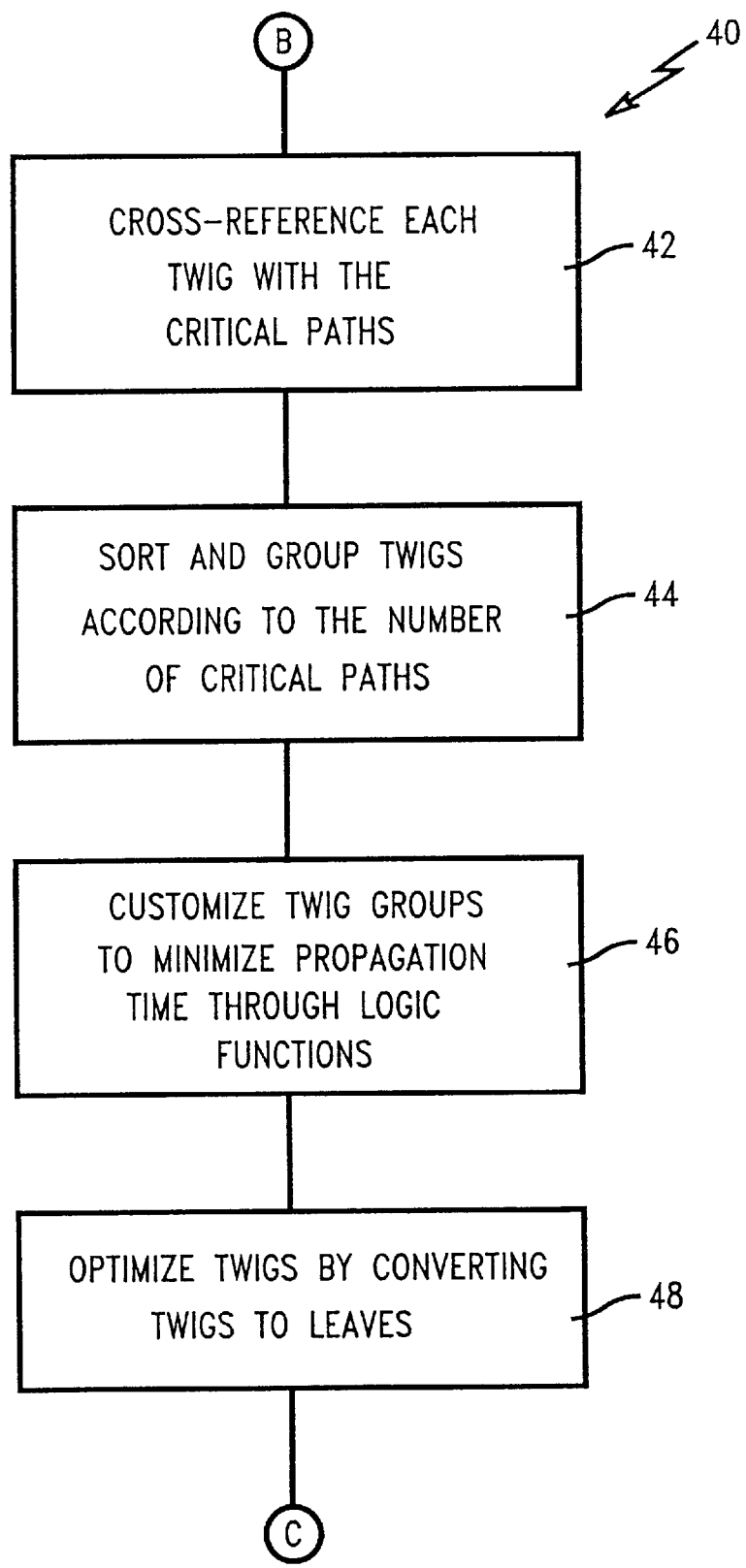
FIG. 2B is a flow chart of the Hedge Analysis Technique for optimizing twigs.
Figure 2C:
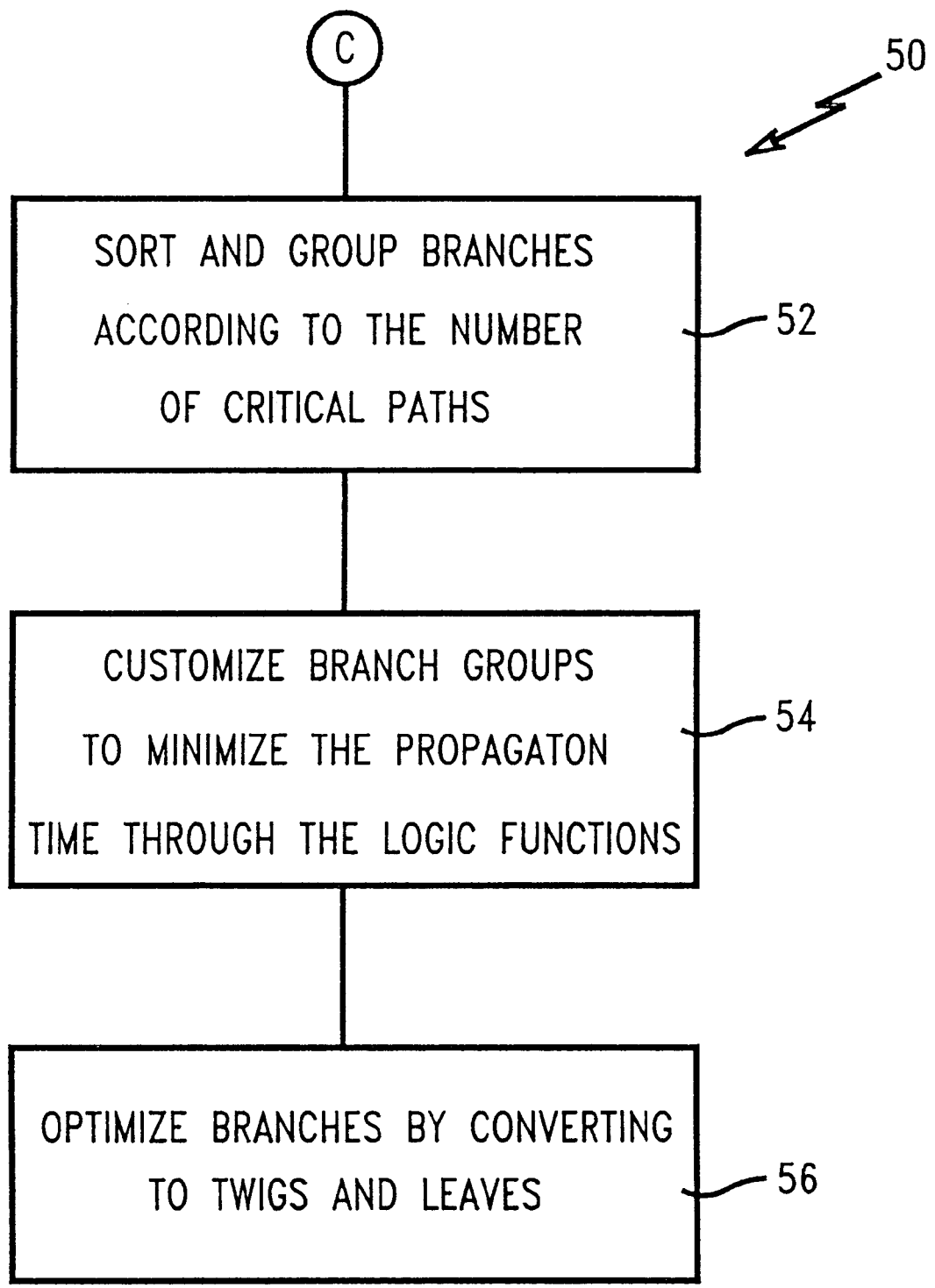
FIG. 2C is a flow chart of the Hedge Analysis Technique for optimizing branches.

FIGS. 2A–2C depict the Hedge Technique Analysis Methodology employed to enhance the performance of the functional logic design while simplifying the underlying circuit. FIG. 2A depicts the first phase 20 of performance tuning, the grouping of critical leaves.

In order to perform this phase, a data structure is generated 22 to identify every leaf within the design. A performance test is run 24 to characterize the logic paths of the initial design. A performance analysis tool such as a computer, analyzer, microprocessor based system, and the like, can then be used to list 26 every functional path within the design. Next, every leaf in the design is cross-referenced 28 within the design to the number of critical paths. Then, a sort 30 is performed wherein the leaves with the largest number of critical paths are grouped together. A first level of performance screen 32 is then conducted to optimize each group of leaves.

The next phase in this methodology, FIG. 2B, is to repeat the process at the twig level 40, i.e., optimize a group of twigs having the largest number of critical paths. First, each twig is cross-referenced 42 with the critical paths. Next, the methodology sorts and groups 44 all the instances that twigs exist within all critical paths and places them in numerical order predicated on the number of critical paths associated with each twig. Those twigs that are in common in the largest number of critical paths are then customized 46 to minimize the propagation through the logic functions, and to eliminate redundant logic paths. Through this process, the twigs are optimized 48 and, whenever possible, converted to leaves. Once the twigs have been optimized, the methodology proceeds to the third phase 50, FIG. 2C, to sort and group 52 branches within the critical paths. Similar to the process for leaves and twigs, the branches are grouped according to those having the largest number of critical paths. The branches are then customized 54 to further minimize the propagation time through the logic functions. The branches are then optimized and reduced 56 to twigs, or in some cases, all the way back to leaves.

Figure 3:
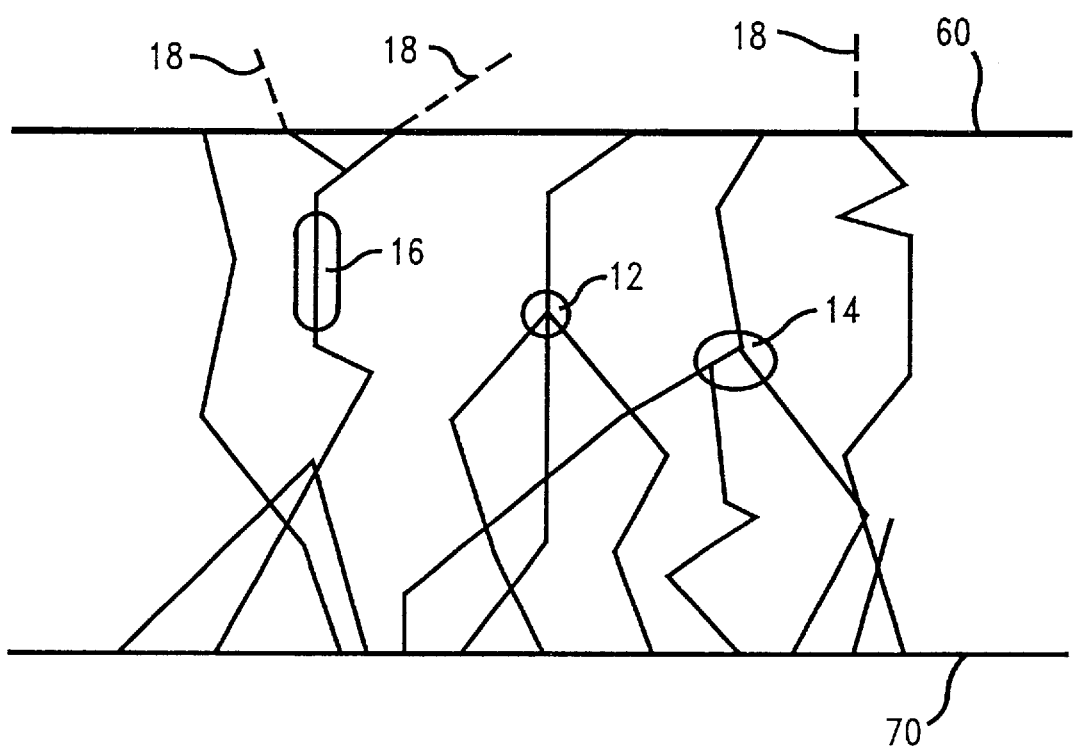
FIG. 3 is a diagram of a logic network having logic paths consisting of leaves, twigs, and branches, reaching a performance wall.
Figure 4:
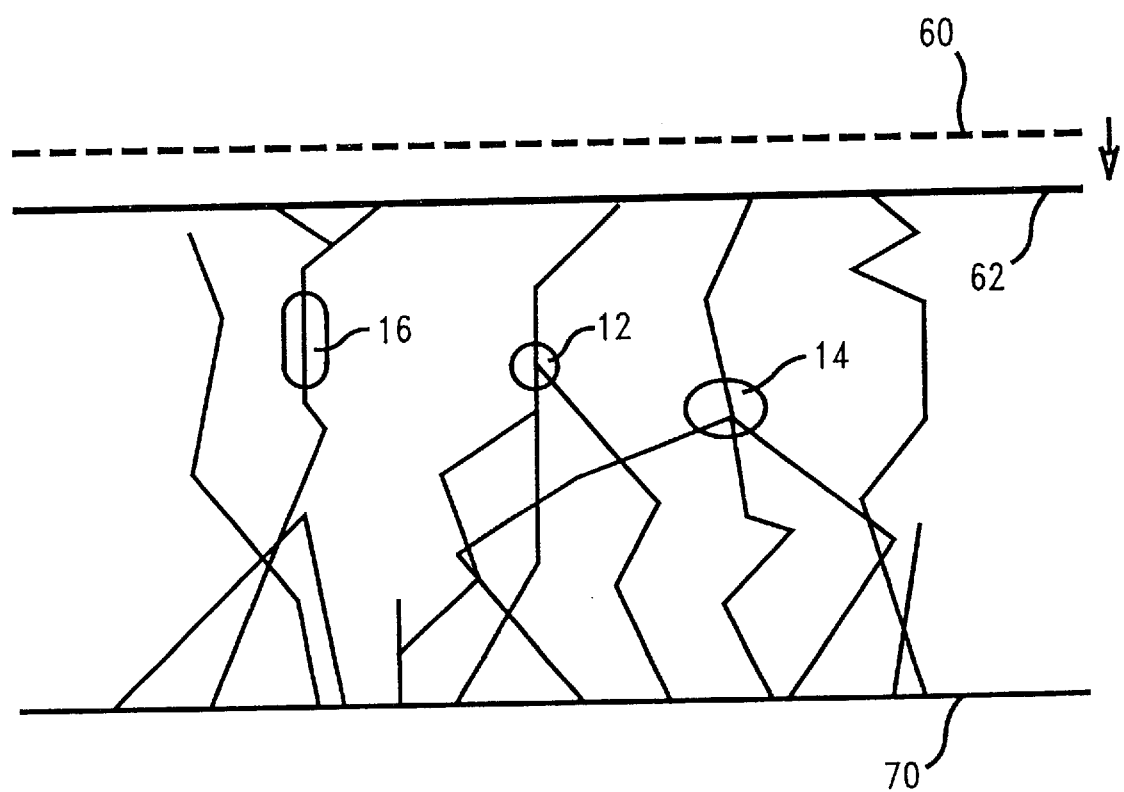
FIG. 4 is the diagram of FIG. 3 with the logic paths subjected to the Hedge Analysis Technique, and the performance wall lowered.

By linking the analysis of books to the timing tool and sorting by the above-identified methodology, a smaller number of branches, twigs, and leaves can be identified to facilitate a redesign of the logic functions of a large scale integrated circuit into more efficient performing units. Thus, as shown in FIGS. 3 and 4, the performance wall 60 (or "Top of the Hedge") may be lowered or trimmed back. FIG. 3 represents a diagram of functional logic paths before being operated on by the Hedge Analysis Technique. Leaves 10, twigs 14, and branches 16 are shown originating from base 70 up to the performance wall 60. These simplified pictorials represent millions of logic paths in a typical large scale integrated circuit. Long paths 18 indicate those that are outside of the desired optimum performance characteristics. FIG. 4 represents the same diagram of functional logic paths after having been operated on by the Hedge Analysis Technique. The lowering of the performance threshold (wall) 62 indicates a more simplified logic circuit analysis capable of accommodating, more efficiently, higher speeds with significantly less redundancy of circuit design.

Application of this methodology has found that on the order of five percent (5%) of the twigs in the functional design of some large scale integrated circuits accounted for ninety percent (90%) of the critical paths. Thus, once the performance wall of a design has been calculated, applying the Hedge Analysis Technique can result in significant performance improvements with minimum custom design effort.

Figure 5:
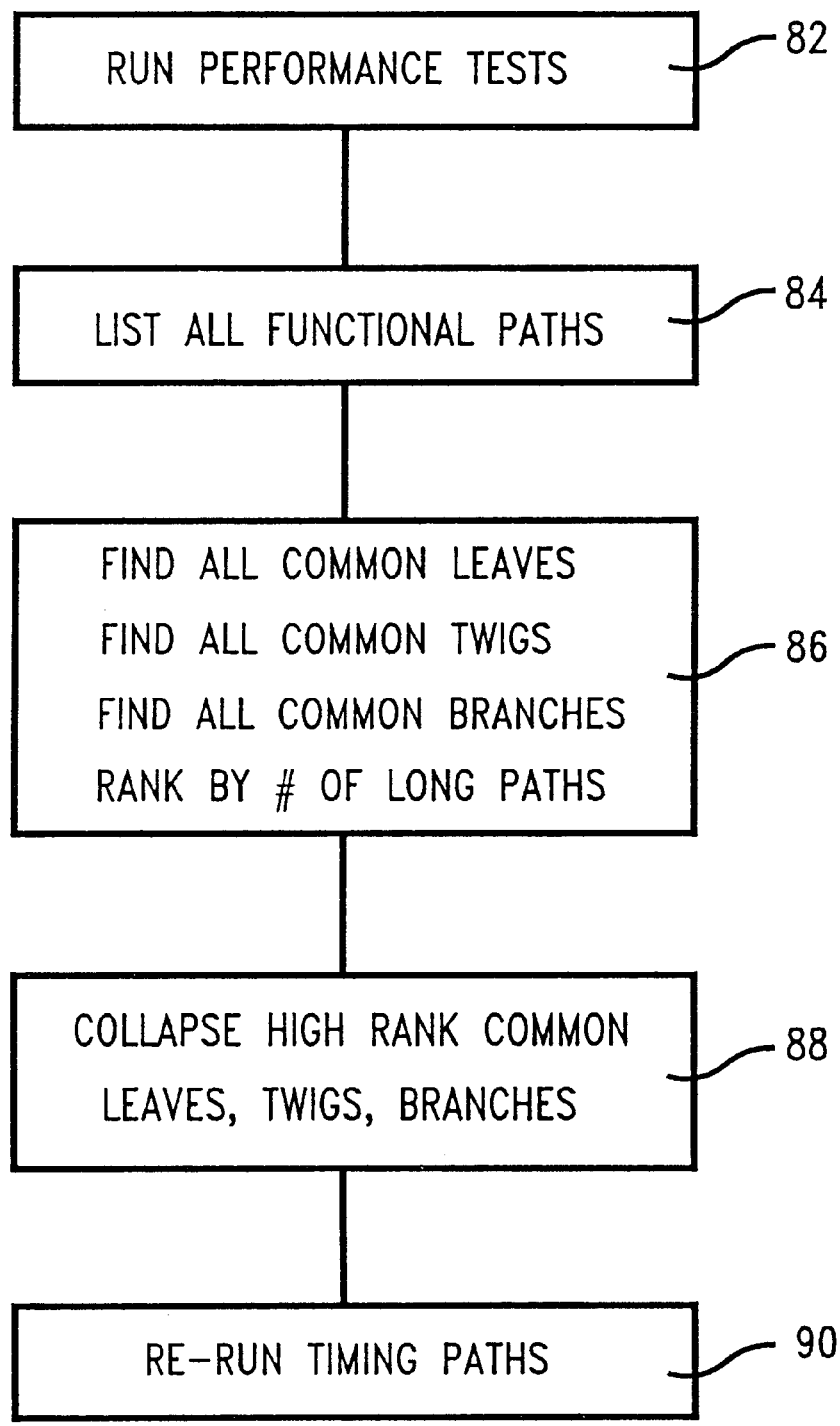
FIG. 5 is a summary flow chart of the Hedge Analysis Technique.

FIG. 5 summarizes the Hedge Analysis Technique for use on large scale integrated circuits. The essential elements of this methodology are as follows: 1) performance tests are run 82; 2) functional paths are identified and listed 84; 3) common leaves, twigs, and branches are identified and ranked 86 by the number of long (critical) paths associated with each; 4) all high ranking common leaves, twigs, and branches are then collapsed 88; and, 5) timing paths are re-run 90 to characterize the final performance rating of the functional design.

Figure 6:
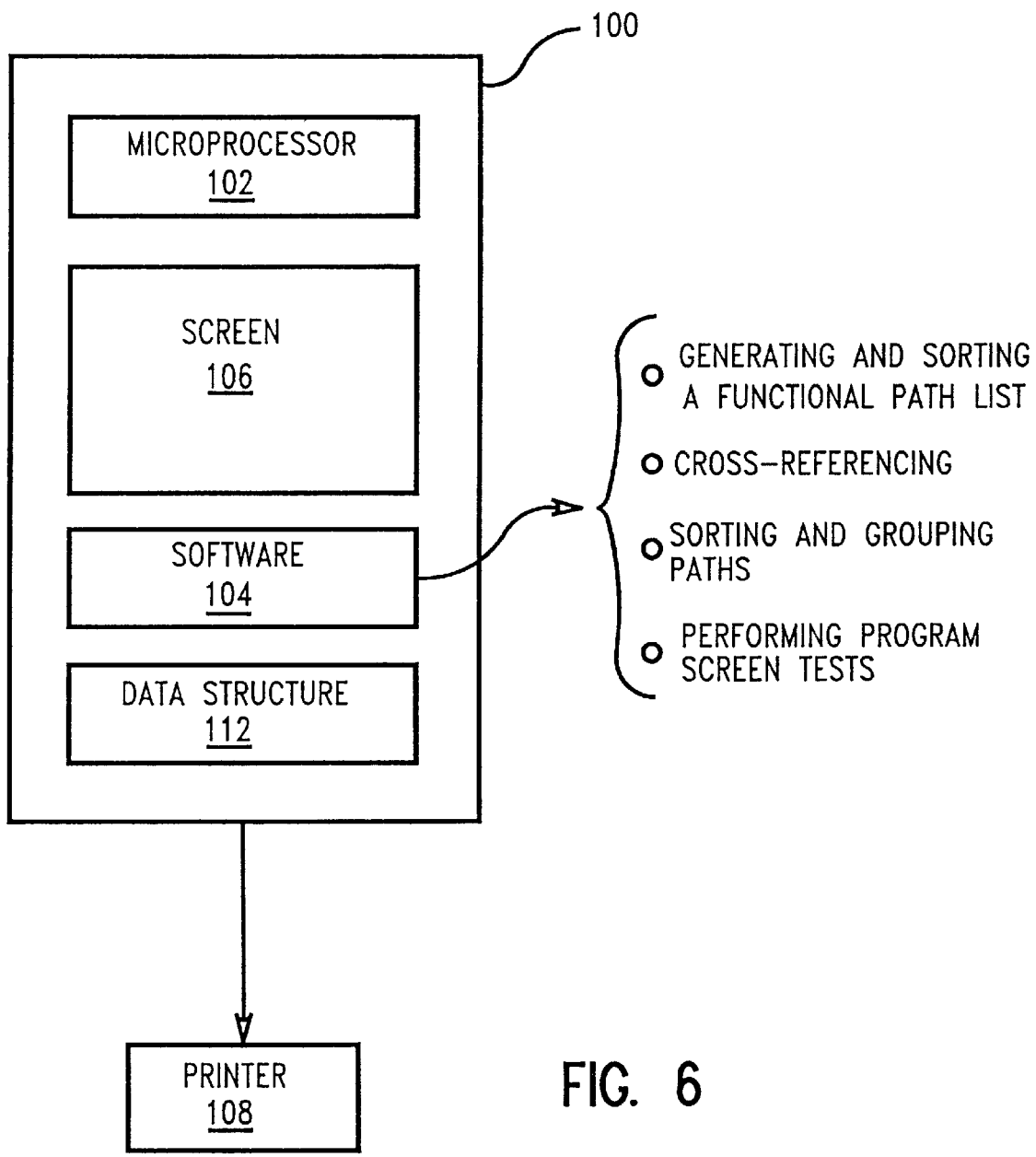
FIG. 6 depicts an apparatus for performing the Hedge Analysis Technique.

An apparatus for performing the Hedge Analysis Technique is illustrated in FIG. 6. A computer 100 is used to perform the algorithms in the software 104 that analyze the network paths of an integrated circuit chip. The algorithms for this technique direct the computer microprocessor 102 to manipulate the data structure 112 such that the following operations are implemented: generating and storing a functional path list, cross-referencing the generated lists, sorting and grouping the paths, and running program screening tests.

The computer 100 has a microprocessor 102 for executing stored programs 104, and includes a data structure 112 on its program storage device for storage of functional paths, timing information, and cross-reference lists.

The computer program or software incorporating the process steps and instructions described above may be stored on an otherwise conventional storage device, such as a semiconductor chip, a read-only memory, or magnetic media such as a diskette or computer hard drive, with is readable and executable by a computer. A screen 106 is able to display the results of the Hedge Analysis Technique. A printer 108 is connected to the computer for printing out the calculated results.

The Hedge Analysis Technique provides an efficient method for analyzing and enhancing the total performance of the logic design of a large scale integrated circuit. It also optimizes the timing of the integrated circuit design. Application of this technique overcomes the shortcomings of prior art methods of minimizing circuit timing in large scale integrated circuits. By employing a computer aided design system, this technique allows for analytical investigation of very large scale integrated circuits in a logical and efficient manner.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of designing a logic circuit comprising the steps of:
   a) identifying functional paths in said logic circuit that include multiple elements in common with other functional paths;
   b) grouping the identified functional paths into groups having functional paths with the same elements in common;

2. A method of designing a logic circuit having a plurality of logic functions, and logic paths having logic path elements, comprising the steps of:
   a) running performance tests on said logic circuit;
   b) listing all of said logic paths in said logic circuit;
   c) finding said logic path elements of said logic paths that are common to one another;
   d) ranking the common logic path elements by the number of critical paths associated with each, assigning a higher ranking value to said common logic path elements with the greater number of said critical paths;
   e) collapsing said higher ranking common logic path elements to minimize propagation times of said logic circuit and eliminate redundancy in said logic functions; and,
   f) re-running said performance tests on said logic circuit.

3. A method of designing a logic circuit having a plurality of logic functions, and logic paths having leaves, twigs, and branches as logic path elements, comprising the steps of:
   a) providing a computer processing system;
   b) generating a data structure to identify each of said logic path leaves in said logic circuit;
   c) running a performance test using said computer processing system on said logic circuit to characterize critical paths of said logic paths;
   d) cross-referencing said logic path leaves to the number of said critical paths associated with each of said logic path leaves;
   e) sorting and grouping said logic path leaves according to said number of said critical paths associated with each of said logic path leaves; and,
   f) performing a first level performance screen on said sorted and grouped logic path leaves.

4. The method of claim 3 further comprising:
   g) cross-referencing said logic path twigs to the number of said critical paths associated with each of said logic path twigs;
   h) sorting and grouping said logic path twigs according to said number of said critical paths associated with each of said logic path twigs;
   i) customizing and optimizing common logic path twig groups of said step (h) to minimize propagation times of said logic circuit and eliminate redundancy in said logic functions; and,
   j) converting one or more of said common logic path twig groups into logic path leaves.

5. The method of claim 4 further comprising:
   k) cross-referencing said logic path branches to the number of said critical paths associated with each of said logic path branches;
   l) sorting and grouping said logic path branches according to said number of said critical paths associated with each of said logic path branches;
   m) customizing and optimizing common logic path branch groups of said step (l) to minimize propagation times of said logic circuit and eliminate redundancy in said logic functions; and,
   n) converting one or more of said common logic path branch groups into logic path twigs.

6. The method of claim 3, wherein said step (c), running a performance test, includes listing said logic paths within said logic circuit.

7. A program storage device readable by a machine, tangibly embodying a program of instructions executable by the machine to perform the method steps for designing a logic circuit having a plurality of logic functions, and logic paths having leaves, twigs, and branches as logic path elements, said method steps comprising:
   a) running performance tests on said logic circuit;
   b) listing all logic paths;
   c) finding said logic path leaves, twigs, and branches of said logic paths that are common to one another;
   d) ranking the common leaves, twigs, and branches of said logic paths by the number of critical paths associated with each, assigning a higher ranking value to the common logic path leaves, twigs, and branches with the greater number of said critical paths;
   e) collapsing the higher ranking common logic path leaves, twigs, and branches, to minimize propagation times of said logic circuit and eliminate redundancy in said logic functions; and,
   f) re-running said performance tests on said logic circuit.

8. A program storage device readable by a machine, tangibly embodying a program of instructions executable by the machine to perform the method steps for designing a logic circuit having a plurality of logic functions, and logic paths having leaves, twigs, and branches as logic path elements, said method steps comprising:
   a) generating a data structure to identify each of said logic path leaves in said logic circuit;
   b) running a performance test on said logic circuit to characterize critical paths of said logic paths;
   c) cross-referencing said logic path leaves to the number of said critical paths associated with each of said logic path leaves;
   d) sorting and grouping said logic path leaves according to said number of said critical paths associated with each of said logic path leaves;
   e) performing a first level performance screen on said sorted and grouped logic path leaves;
   f) cross-referencing said logic path twigs to the number of said critical paths associated with each of said path logic path twigs;
   g) sorting and grouping said logic path twigs according to said number of said critical paths associated with each of said logic path twigs;
   h) customizing and optimizing common logic path twig groups of said step (g) to minimize propagation times of said logic circuit and eliminate redundancy in said logic functions;
   i) converting one or more of said common logic path twig groups into logic path leaves;
   j) cross-referencing said logic path branches to the number of said critical paths associated with each of said logic path branches;
   k) sorting and grouping said logic path branches according to said number of said critical paths associated with each of said logic path branches;
   l) customizing and optimizing common logic path branch groups of said step (k) to minimize propagation times of said logic circuit and eliminate redundancy in said logic functions; and, m) converting one or more of said common logic path branch groups into logic path twigs.

9. A program storage device readable by a machine, tangibly embodying a program of instructions executable by the machine to perform the method steps for designing a logic circuit having a plurality of logic functions, and logic paths having leaves, twigs, and branches as logic path elements, said method steps comprising:

a) identifying functional paths in said logic circuit that include multiple elements in common with other functional paths;

b) grouping the identified functional paths into groups having functional paths with the same elements in common;

c) ranking said groups according to a number of elements that said functional paths in each group have in common; and, d) optimizing a performance of a first group of functional paths into a second group of functional paths by customizing and collapsing said functional paths, wherein a number of common elements in the functional paths of the second group is less than a number of common elements in the functional paths of the first group.

\* \* \* \* \*